METHOD OF MAKING SEMICONDUCTOR DEVICES
Original Filed Feb. 25, 1965
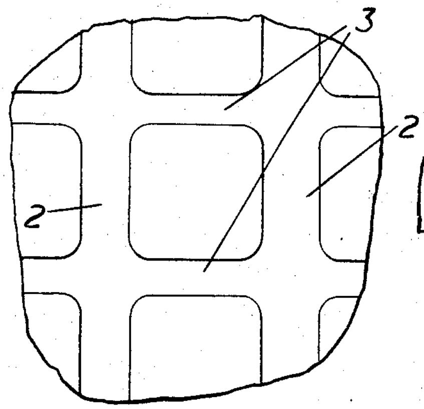
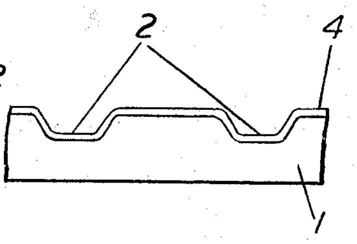
FIG. 2.
FIG. 1.
FIG. 3.
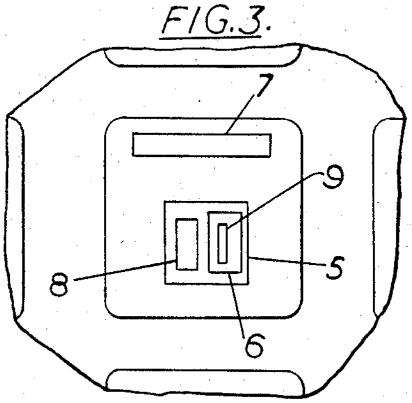
FIG. 4.
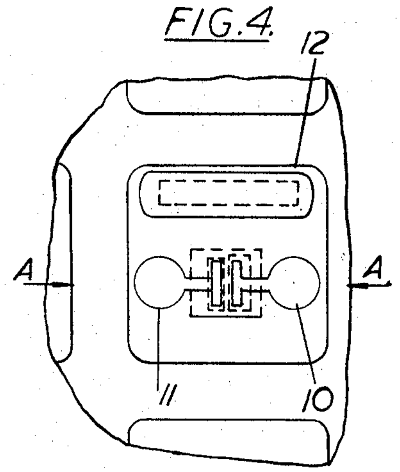
FIG. 5.
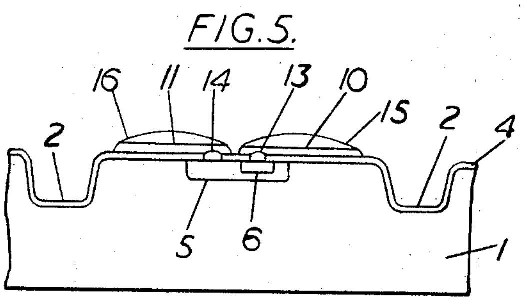
Inventor
JOHN HILL
By Percy P. Lantzy
Attorney Inventor
JOHN HILL
By [signature]
Attorney Inventor
JOHN HILL
By [signature]
Attorney April 29, 1969 J. HILL 3,440,717

METHOD OF MAKING SEMICONDUCTOR DEVICES

Original Filed Feb. 25, 1965 Sheet 4 of 5

Inventor
JOHN HILL
By Percy P. Lantzy
Attorney

April 29, 1969 J. HILL 3,440,717
METHOD OF MAKING SEMICONDUCTOR DEVICES
Original Filed Feb. 25, 1965 Sheet 5 of 5
FIG. 15a.
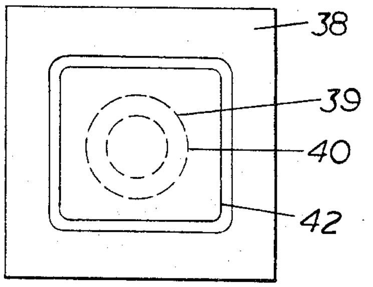
FIG. 18a. FIG. 18c.
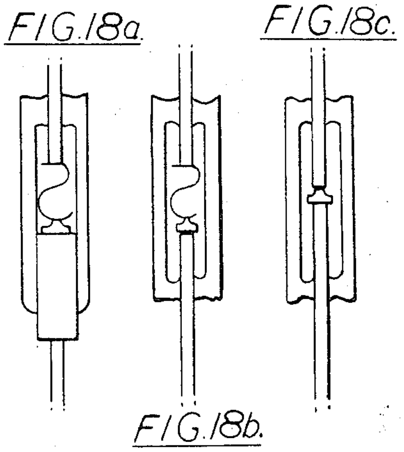
FIG. 18b.
FIG. 15b.
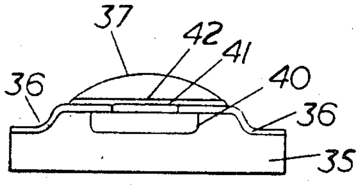
FIG. 16.
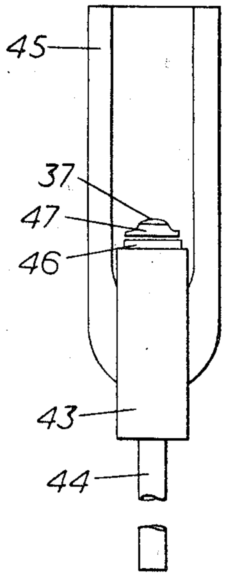
FIG. 17.
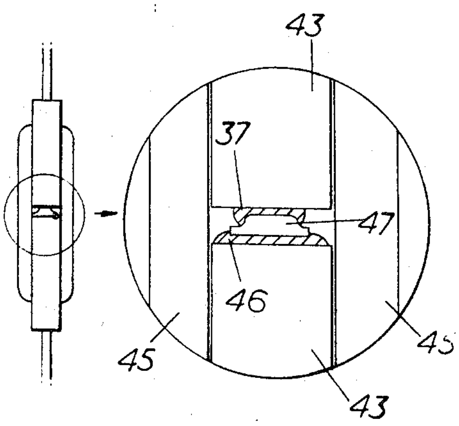
Inventor
JOHN HILL
By [signature]
Attorney United States Patent Office 3,440,717
Patented Apr. 29, 1969

3,440,717

METHOD OF MAKING SEMICONDUCTOR DEVICES

John Hill, Melrose Westleigh Drive, Bickley, Bromley, Kent, England

Continuation of application Ser. No. 435,373, Feb. 25, 1965. This application Mar. 16, 1967, Ser. No. 632,874
Claims priority, application Great Britain, Mar. 6, 1964, 9,636/64
Int. Cl. H01l 7/64
U.S. Cl. 29—588 4 Claims

ABSTRACT OF THE DISCLOSURE

Method for manufacturing a semiconductor device by assembling a semiconductor wafer having all contacts on one face thereof to a header having a plurality of contact areas adapted to be bonded to corresponding contacts of the wafer. The wafer has a ledge to facilitate mechanical sensing and orientation. The apparatus used selects those wafers having a preferred orientation, aligns the wafers with the headers, and bonds the header contact areas to the corresponding wafer contact regions to complete the assembly operation. Thereafter the semiconductor device is suitably encased or encapsulated.

This application is a continuation of U.S. Patent application Ser. No. 435,373, filed Feb. 25, 1965 now abandoned and assigned to the assignee of the instant application.

This invention relates to the assembly of semiconductor device wafers with suitable mounts so as to produce encapsulated devices.

The object of the present invention is to provide a method of mechanised assembly of semiconductor wafers with suitable mounts and to provide mounted wafers which are less liable to accidental misconnections such as short circuits.

According to the present invention there is provided a semiconductor device wafer at least one edge of which is formed into the shape of a ledge, the semiconductor material having been removed in that region to leave a step, the shoulder between the face of the wafer and the wall of the ledge being rounded.

There is also provided a method of mounting semiconductor device wafers on headers, in which the attitude of the wafer is sensed by reference to a ledge, running along at least one edge of the wafer, so that only wafers in the desired attitude shall be delivered to the mounting position for mounting on headers.

A method of mechanism assembly, according to the present invention, will now be described with reference to the accompanying diagrams, in which FIG. 1 represents a part plan view of a slice of silicon in which a pattern of grooves has been made;

FIG. 2 represents a part section view of the same slice;

FIG. 3 represents in plan view a transistor formed in the surface of the silicon slice, in an island formed by the pattern of grooves;

FIG. 4 represents in plan view a transistor on which large area contacts have been produced;

FIG. 5 represents in section view a transistor as above;

FIG. 8(*b*) represents in section view the conveyor illustrated above;

FIG. 9(*b*) represents the same apparatus in side view;

FIG. 14(*b*) represents in side view an assembly, as in FIG. 12, encapsulated by a larger quantity of thermosetting or thermoplastic material, so as to produce a device which falls within the limits of a standardised outline;

FIG. 15(*a*) represents in plan view a wafer separated from the silicon slice, which consists of a plateau in which is formed a diode, on which are large area contacts to that diode, and around which on all sides is a ledge of silicon;

FIG. 15(*b*) represents in section view the wafer represented in FIG. 15(*a*);

FIG. 16 represents in section view a glass-encapsulated diode subassembly into which are loaded a diode wafer and solder preform;

FIG. 17 represents a completed glass-encapsulated diode, the diode wafer region of which is represented in larger scale;

Figure 6:
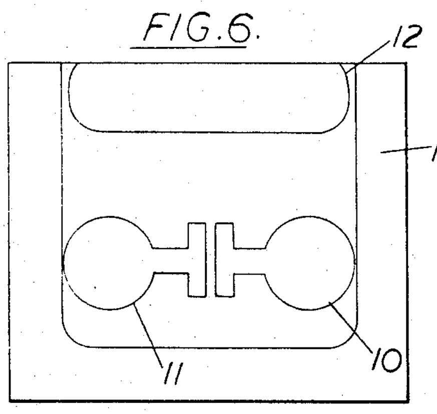
FIG. 6 represents in plan view a wafer separated from the silicon slice which consists of a plateau in which is formed a transistor, on which are large area contacts to that transistor and around which, on three sides, is a ledge of silicon.

FIG. 18(*a*), (*b*), and (*c*) represents alternative configurations of glass-encapsulation from that represented in FIG. 17.

A slice of n type silicon 1 has an array of grooves 2 and 3 formed in one face so that the surface is separated into flat-topped islands, as shown in FIG. 1 in partial plan form, and also in FIG. 2 in section. The dimensions are typically as follows: groove depth, 3 mils; groove 2, width, 14 mils; groove 3, width, 9 mils; island, 30 mils by 25 mils; slice thickness 8 mils. The grooves may be formed by etching or by mechanical means, a slow chemical etching process being preferred so as to result in rounded shoulders at the surface.

The grooved slice is then subjected to an oxidation process, such as the action of steam or oxygen at 1100° C., so as to produce a layer of clean oxide 4 on the surface of about 1.5 microns in thickness, as illustrated in FIG. 2.

An array of npn planar transistors are then produced in the grooved face of the slice by the known method, as described in U.S. Patent application No. 386,148, filed July 30, 1964, abandoned on June 20, 1966, so that one transistor is formed in each island. The transistors are of the type described in the above patent specification, wherein the collector contact is brought to the front face, so that all three contacts are on the surface of the island. One such island is illustrated in FIG. 3 where the base junction is indicated as item 5, the emitter junction as item 6, the collector region exposed through the aperture in the silicon oxide is indicated as item 7, the base region through the oxide aperture 8, and the emitter region through the oxide aperture 9. The oxide aperture 7 may be replaced with a shallow groove cut across the slice by mechanical or photo-etch-resist methods, to pass through the position illustrated as being occupied by the oxide aperture 7.

Metallic contacts may be deposited within those apertures, and gold-chrome large area contacts or equivalent materials are deposited on the surface, adherent to both the oxide and the metallic contact, as described in the above patent specification. The resulting configuration is illustrated in FIG. 4, in which items 10, 11 and 12 are the large area contacts for the emitter, base and collector, respectively.

The slice is then dipped in a bath of molten solder, as described in U.S. Patent No. 3,324,357, so as to produce low mounds of solder on the large area contacts, as illustrated in cross-section in FIG. 5, in which items 13 and 14 are the initial metallic contacts to the emitter and base, respectively, that were deposited before the large area contacts 10 and 11 which overlay them, and in which items 15 and 16 are the low mounds of solder on the emitter and base large area contacts, respectively. A similar low mound of solder is produced on the large area contact 12, to the collector electrode.

The slice is then separated into wafers by cutting with a suitable mechanical contrivance, such as, for instance, a high speed rotary saw, ultrasonic or spark erosion cutter. The preferred means is the rotary saw. The positions of the cuts, which are made in the grooves, are important. Those cuts made in grooves 2 are made centrally, so as to leave a ledge on the wafers on either side of the groove. Those cuts made in grooves 3 are made at one side of the groove so as to leave little or no trace of the groove adjacent to the collector large area contacts, and to leave a ledge adjacent to the other contacts which is substantially of the same width as the ledges on the other two sides. The width of the cut, i.e. the width of silicon lost during cutting, is typically 4 mils. A separated wafer is illustrated in FIG. 6, in which the ledge, indicated as item 17 runs around three sides of the wafer, is about five mils in width, and is covered with oxide.

Figure 7:
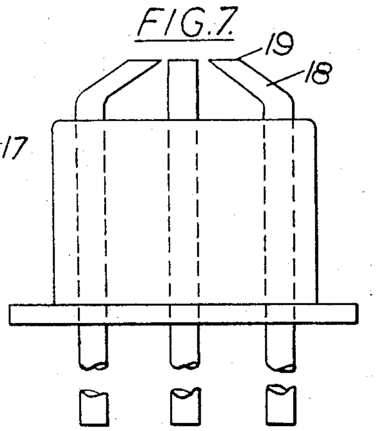
FIG. 7 represents in side view a three-lead header whose three short leads have been "formed" so as to provide contacts which are consistent with the large area contacts on the transistor wafer.

The wafer, as illustrated in FIG. 6, may now be mounted on a variety of headers or substrates. The preferred header is similar to that described in U.S. Patent No. 3,324,357, and is illustrated in FIG. 7, in which three lead wires 18 pass through a glass-metal seal and whose shape are formed on the mounting side so that the ends are brought closer together. Flats 19 are produced on the ends of the leads to be approximately co-planar, that plane being at right angles to the general direction of the leads on the far side of the glass-metal seal and between 50 mils and 100 mils from the near face of the seal. The operation is conducted so that the three flats bear that relationship to one another that makes it possible to place the transistor, illustrated in FIG. 6, on the header, contacts to flats so that each contact rests on the correct flat and on that flat only.

The mounting operation may be conducted manually or mechanically. It is the latter method for which the wafer is intended and which will now be described. The ledge around three sides of the wafer is used both to locate the wafer correctly into position and to sense its attitude at various stages of its movement so as to effect that location. The configuration of the wafer allows a variety of methods to be used to effect the above purposes, that which is described below is typical of those methods.

Figure 8A:
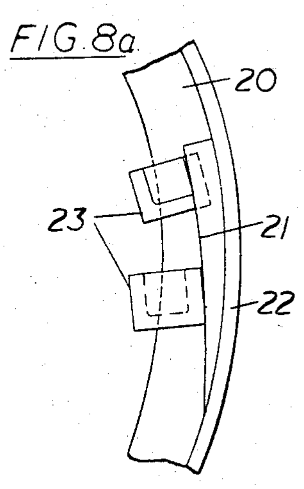
FIG. 8(*a*) represents in plan view part of a helical wafer conveyor of a vibratory feed mechanism, illustrating a member which rejects inverted wafers.
Figure 8B:
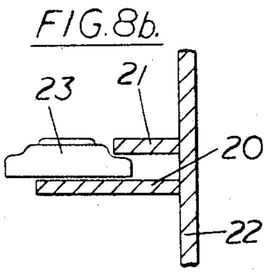

It is well known that a suitable method for transferring small objects from one place to another is by use of a vibratory feed mechanism. This mechanism often takes the form of a cylinder, up the inside of which runs a helical ramp, the entire mechanism being vibrated by the oscillations of a piezo-electric transducer. Wafers, as illustrated in FIG. 6, are fed into the input bowl of such a mechanism and progress up the ramp. The attitude of the wafers on the ramp will be, generally, with a flat edge tangential to the wall of the cylinder at that point. Any edge of the wafer may be against that wall, in addition the wafer may have its "contacts" side up, or down. Only one attitude is required, all the others may be rejected by sensing, making use of the ledge around the wafer. Consider first a wafer 23 with its "contacts" side down, which is an unwanted attitude. In progressing up the ramp 20 the wafers encounter a projection 21 from the wall 22 which progressively widens as illustrated in FIG. 8(*a*) but which has sufficient space between it and the ramp to allow the ledge of a wafer in the "correct side up" attitude to pass below it as illustrated in FIG. 8(*b*). A "contacts" side down wafer will be guided off the ramp, as shown in FIG. 8(*a*), whereas a "contacts" side up wafer will, in most cases, proceed up the ramp beyond the projection. The wafers guided off the ramp will fall back into the input bowl.

Figure 9B:
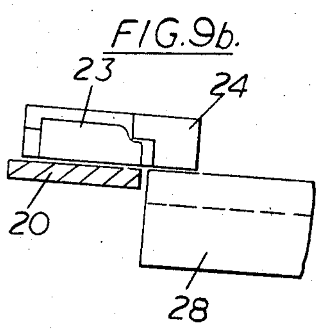
FIG. 9(*a*) represents in plan view selecting those wafers with the required attitude.
Figure 9A:
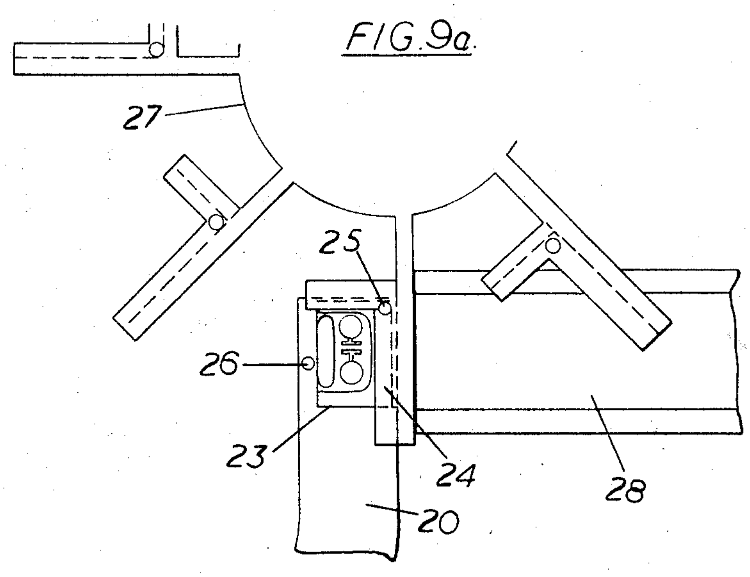

At the top of the ramp wafers may be fed into an alignment position as illustrated in FIG. 9, which is one of many possible ways of using the ledge around the wafer to sense its attitude. Each wafer progresses from the ramp 20 into an alignment position. This position is inclined as illustrated in FIG. 9(*b*) so that the wafers keep to the side corresponding to the wall side of the ramp. A projecting member 24 is used to sense the attitude of the wafer in the alignment position. The attitude of the wafer illustrated in FIG. 9 is the only attitude required. It is the only one which will allow the wafer to obscure the photocell aperture 25 but not obscure the photocell aperture 26. If the correct combination of photocell outputs is obtained, the turret 27 revolves anticlockwise and the wafer is deposited on the surface 28 for the next operation. If the combination of photocell outputs is incorrect the turret revolves clockwise and the wafer is deposited back in the input bowl of the vibratory feeding mechanism. It is possible to include some form of gating mechanism at the head of ramp 20 to ensure that only one wafer at a time is in contact with the attitude sensing mechanism.

Figure 10:
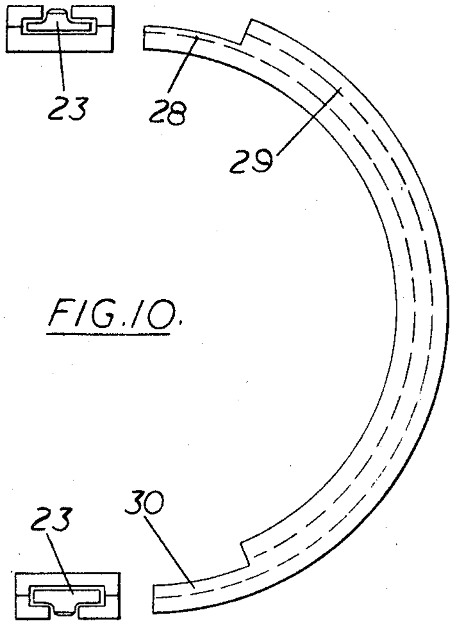
FIG. 10 represents in side and end views an apparatus for inverting wafers of the required attitude.
Figure 11:
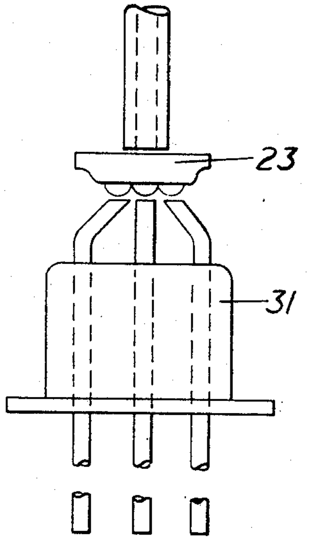
FIG. 11 represents in side view a transistor wafer, held by a vacuum pick up mechanism, on the contacts of a prepared header.

The wafers in the suitable attitude are most conveniently inverted before being presented to a header. A suitable device for achieving this object is illustrated in FIG. 10. A piece of channeled bar 29 is bent into a curved shape, the rate of curvature of which is exaggerated in the drawing, for convenience, and portions are cut from it so that a wafer 23 may be placed on the exposed flat inner base of the channel 28, from which it proceeds under the influence of gravity around the curved channel to the other cut-away portion where it sits on the exposed inner surface of the tines 30. The material of the channeled bar would conveniently be nylon or polytetrafluorethylene which have low coefficients of friction and are capable of being kept in a state of extreme cleanliness. The wafer 23 may be loaded on to the inverting device at 28 by means of the arms of turret 27, operating at the alignment position. The inverted wafer may be unloaded from the tines 30 by a vacuum-pick-up mechanism and transferred, by means of that mechanism held at the end of a swinging arm, to the flats 19 on the lead wires 18 of the header 31 to which it is to be attached.

The headers 31 are automatically conveyed to the mounting position on a conveyor which may be of radial or linear type, into which they have been loaded in known manner. The mechanism through which the wafer 23 has passed, that which was described above being one possible form, ensures that the attitude of the wafer is that that the contacts 10, 11 and 12 are placed on the correct lead wire flat, respectively, and only on that flat.

The wafer 23 and the header 31 are joined by soldering. It may be necessary to pre-wet the flats 19 with solder and/or with flux. This depends on the type of solder that has been deposited on the contacts 10, 11 and 12. The heat required for this operation may be obtained from a radiant heater, a flow of heated gas, the contact of a heated member, or other suitable method. Another purpose of the ledge structure around the wafer is apparent here. The solder-coated large-area contacts to the transistor are close to the rounded shoulder of the wafer above the ledge and excess solder pressed away from the contact during mounting tends to run over that shoulder and collect harmlessly on the ledge, insulated from the wafer by the oxide layer. This purpose is of greater importance in the case of mounting a wafer on to large flats, or on to a plane surface with discrete contact area, or where a diode wafer is being mounted between two headed lead wires, which latter will be briefly described after this embodiment.

Figure 12:
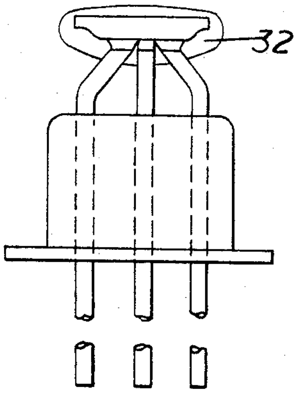
FIG. 12 represents in side view an assembly of a transistor wafer soldered to a header and resin applied for extra mechanism strength.

After re-solidification of the solder the vacuum pick-up mechanism is removed, the assembly illustrated in FIG. 12 is passed along the conveyor to the unloading position from which it is removed by known means. It may be advantageous to introduce a layer of silicone resin 32 around the wafer and the lead wire terminations, as illustrated in FIG. 12. This would result in greater mechanical strength for the assembly. The requirement might arise for instance as a result of the use of a particular solder or if the transistor is to be used in a particular apparatus.

Figure 13:
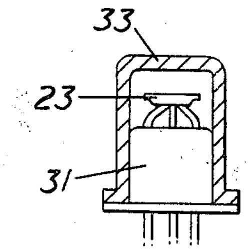
FIG. 13 represents in side view an assembly, as in FIG. 12, encapsulated by a metallic cap which is welded into position.
Figure 14A:
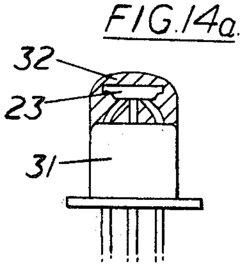
FIG. 14(*a*) represents in side view an assembly as in FIG. 12, encapsulated by a low dome of thermosetting or thermoplastic material plated over the wafer.
Figure 14B:
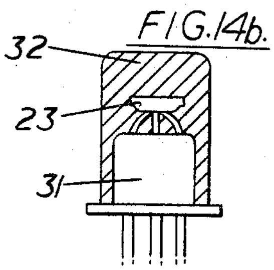

In U.S. Patent No. 3,324,357, a review is given of the means of encapsulation of an assembly which from the encapsulation point of view, is identical with that in FIG. 12. This encapsulation may be by means of a metallic cap 33 welded to the flange of the header 31, as illustrated in FIG. 13, or by means of a thermosetting or thermoplastic material 34 adhering to the face of the header 31, as illustrated in FIG. 14, in which *a* represents a low dome of such material and *b* represents an accurately moulded "case" which complies with a standardised outline, for instance the SO–12 outline of the Electronic Valve and Semiconductor Manufacturers Association, and is thus outwardly similar to that illustrated in FIG. 13.

As was indicated in the above embodiment, the provision of a ledge around a diode wafer is of even greater importance for collecting excess solder than in the transistor embodiment. A diode wafer 35 is illustrated in FIG. 15, in plan in part *a*, in section in part *b*. An oxide layer 36 covers the top surface of the wafer and the ledge with the exception of an aperture 39 above the p type region formed in the otherwise n-type wafer, but covering the pn junction 40. An initial metallic contact 41 may be utilised before the large area contact 42 is deposited across the top surface of the island. A low mound of solder 37 is produced on the large area contact. The ledge 38 had been produced at an early stage, as was that of the transistor wafer. In conveying the wafer to its mounting position the ledge may be used for sensing, as in the transistor embodiment, but only to ensure that it is the correct way up. The encapsulation preferred for this wafer is the double-plug glass body, in which a copper covered nickel-iron plug 43 is welded to a lead wire 44, which may be of copper, and is joined to a soft lead glass tube 45 by heating the assembly with a hot flame or a radiant heater so that the glass becomes plastic and collapses on to the plug 43 and makes a mechanically strong hermetically sealed joint with the oxide layer at the surface of the copper. The cooled assembly is then loaded with a solder preform 46 and the prepared diode wafer 47 which is the wafer as illustrated in FIGURE 15. A furnacing operation at roughly 50° C. above the melting point of the solder, holding down the wafer with a hollow weight, precedes the final encapsulation.

A second plug, similar to that used in the assembly illustrated in FIG. 16, is inserted within the tube of that assembly and pressed against the solder 37 on the diode wafer contact. The unsealed half of the assembly is then heated, as was the other half, to make the glass plastic and collapse on to the second plug and make a mechanically strong hermetic seal to the surface of it. During this operation the solder layers 37 and 46 become remolten and adhere to the faces of the plugs 43. In the absence of the ledge 38, the amount of solder that could be used must be very small to prevent the two layers coming into contact and "shorting-out" the diode wafer. The ledge 38, together with the face of the plug, form a cavity in which solder 37 can safely accumulate, insulated from the wafer by the oxide layer on the wafer surface.

The "double plug" encapsulation of diode wafer in a glass tube is that which requires the greatest care to prevent solder from rendering the unit a short circuit. However, the alternative methods of providing contacts within the glass tube, as illustrated in FIG. 18, also require care and derive benefit from the circumferential ledge. In FIG. 18(*a*) the wafer is mounted on a plug, as in FIG. 17, but the contact to the other face is provided by a metallic spring welded to the butt of a lead wire which enters the glass encapsulation through a glass bead, to which it is hermetically sealed, the bead being joined to the glass tube as a final operation. In FIG. 18(*b*) the wafer is mounted on the butt end of a lead wire, similar to that described above in relation to the contact to the other face of the wafer. The contact to the other face is the same in both cases as illustrated.

Another suitable glass tube encapsulation, illustrated in FIG. 18(*c*), has the elements as in FIG. 18(*b*), with the exception of the metallic spring welded to the butt of the second lead wire. In this case the butt end is soldered directly to the second contact of the wafer.

The use of a ledge around a wafer is not restricted to devices made from silicon. This material is a convenient one for the purpose, but other materials are also suitable. Germanium, and the more common intermetallic semiconductors for instance gallium arsenide, are immediately applicable, the problem being one of passivation of the device in the wafer rather than of producing a ledge around it. Silicon is particularly suitable because its oxide effects a suitable passivation of the surface and allows contact materials to be harmlessly placed over pn junction surface terminations and on to the ledge. Other materials are not so suitable in this respect, but passivation may be effected by deposition of a layer of silicon oxide, or other suitable oxide, or of resin or other material suitable for the purpose. Similarly, the use of the planar technique for the manufacture of the devices in the semiconductor slice is of great convenience, leading as it does to wafers which are suitably passivated without further processing. However, any method of manufacture of solid state diffused semiconductor devices, such as the "mesa" technique, for instance, may be used if it is possible to passivate the surface, including the ledge, in a subsequent process.

The above reliance on a passivated-surfaced wafer is appropriate where the invention is utilised in both its aspects, that is in a mechanical feeding of a suitably aligned wafer to an assembly position and in the mechanical assembly of the wafer and its header or mount by the use of large area contacts. However, a wafer with a ledge but with no large area contacts could be mechanically fed to the assembly position and contacts made to its either mechanically, or with a manual interpolation in the process, without the necessity of large area contacts.

The use of an n-type junction slice in the embodiment was a matter of convenience. A p-type slice could also be the starting material for suitable devices. Only a transistor and a diode have been described, these are the preferred uses of the invention, but other semiconductor devices such as silicon controlled rectifiers, tunnel diodes or rectifiers, or combinations of devices on one wafer or on one substrate may also be processed in this manner.

The size of the islands produced in the surface of the slice may be varied to suit the application, as may be the shape. The transistor embodiment described a medium power transistor, a smaller wafer (and hence island) could have been produced whilst still retaining the same transistor configuration. In this case the details of handling the wafer in the feeding mechanism decided its size and shape, other mechanisms could require different dimensions. A larger device, such as a high power transistor, could force an increase in dimensions. The rectangular shape is convenient but not essential. In certain circumstances a cost reduction could be effected by the use of a triangular configuration. If the islands are cut by ultrasonic or spark-erosion machining or chemical etching or any other method that does not require the grooves in the slice to be made as straight intersecting lines, then the islands need not be of the same configuration as the wafer. For example, a circular island could be produced on a rectangular wafer. This could assist if the wafer is to be positioned in a recessed header. The thickness of the wafer is of less importance and is chosen on mechanical considerations with regard to the strength of the grooved slice and of the separated wafer. In the case of non-epitaxial slices where contacts are made to both sides, however, this dimension has to be kept small in order to reduce electrical impedances.

Although there are advantages to be gained in grouping the contacts to the device electrodes on one face of the wafer, it would be equally possible to produce a device wafer with contacts to both sides, with suitable alignment ledges around the edges. Such wafers could be processed as described in the transistor embodiment with the exception that bonding of lead wires or contact areas to the wafer contacts would be required on both faces of the wafer, either simultaneously or sequentially. A multi-electrode device such as a four terminal thyristor would be suitable for such an assembly.

The gold-chromium large area contact is deposited over the oxide and the contact to the semiconductor. This latter is often aluminum where silicon is the semiconductor. However, various contact systems can be used such as nickel or other deposited metal. Other alternative methods include contacting the gold-chromium layer direct to the surface of the semiconductor which may or may not have had an extra deposition of impurities at that point to provide a low impedance, non-injecting contact.

Other layers than gold-chromium are also possible. For instance, aluminum has been used for this purpose, as has silver-manganese and certain alloys of tungsten.

The configuration of the ledge around the wafer may be selected to suit the particular application. The two embodiments of this specification refer to a ledge around four sides and around three sides of the wafer respectively. In both cases the ledge was adjacent to the same wafer face. Variations beyond these illustrations are possible. Even a ledge along a single edge may be used for sensing the attitude of a wafer; such a use would be possible if a "run-off" of solder during bonding is confined to that edge of the wafer. In forming a ledge it is only necessary to remove less than half the thickness of the wafer, hence ledges may be formed on both faces if required to accommodate solder from both faces. The application of the principles of the provisions of ledges for sensing the attitude of the wafer and for accommodating a "run-off" of solder from a contact on the face of that wafer can lead to a great many different configurations of ledges and contacts with different device wafers.

The provision of low mounds of solder on the contacts of the wafers is effected by dipping the slice in a bath of solder as described in U.S. Patent No. 3,324,357. Suitable solders are tin-lead eutectic or "Comsol" or any solder which is capable of being used with a water-soluble flux. It is not necessary to coat the wafer contacts with solder if the header contacts are pre-coated.

The methods of feeding the wafers on a helical ramp and of sensing their attitude during that feeding, as described in the embodiments, are examples of the methods that are possible. A linear ramp is equally of use as is a helical. The techniques of sensing by appropriately positioned stop members and photocells may be applied to any method of feeding the wafers.

The limitations placed on the header are (i) that it shall be consistent with the contacts on the device wafer in as much as the configurations of both must make it possible only to bond the correct contacts when alignment is correct, (ii) that it shall be capable of being mechanically fed to the assembly position, and (iii) that the materials from which the header is constructed shall be capable of withstanding the processes involved, notably the bonding process. Lead wires passing through glass, ceramic, plastic or other insulating material with suitable mechanical properties, the ends of the leads being formed as illustrated in the first embodiment are an acceptable variety of header. These wires may contact plates, or deposited areas on the header, or small printed circuit boards, or other intermediate contact material. The contacts of the header assembly as presented to the wafer at bonding may be merely clean and ready to accept solder from the wafer contacts, or may be presoldered as for instance by solder dipping or flame soldering or a solder preform may be used where appropriate.

Encapsulation is mainly required as a mechanical protection. A thin layer of resin may be placed over the wafer and the butt-ends of the leads for this purpose in the type of mounting described in the first embodiment and it is possible to use the device in that form. Normally, however, more protection is required. A description of means by which this can be achieved is given in U.S. Patent No. 3,324,357. The known method of encapsulation within a glass tube, as described in the second embodiment, is often adopted for diodes or other small two-terminal devices, but such devices may be mounted as in the first embodiment or on other headers, such as, for instance as described in U.S. Patent No. 3,243,670, or in British patent specification No. 870,599 (Application No. 12744/59 Fishman-Dunster 2–1), both of which are capable of being assembled according to the principles of this invention.

I claim:

1. A process for assembling semiconductor wafers on headers, each said wafer having a peripheral ledge adjacent one major surface thereof and a plurality of electrodes on a given major surface thereof, comprising the steps of:

selecting from a number of said wafers, by sensing the orientation of said ledge, those wafers which have said major surface oriented in a given direction;

feeding said selected wafers to an alignment station;

choosing at said alignment station those of said selected wafers which have said electrodes in a preferred orientation;

feeding said chosen wafers in sequence to an assembly station;

feeding said headers in sequence to said assembly station, each of said headers having a corresponding plurality of associated terminal contact areas, such that each said contact area is adjacent a corresponding one of said electrodes; and bonding said contact areas directly to said corresponding electrodes at said assembly station to sequentially assemble said wafers to said headers.

2. A process according to claim 1, comprising the additional step of encapsulating each said assembled wafer.

3. A process according to claim 1, wherein said wafers are inverted during said chosen wafer feeding step.

4. A a process according to claim 1, wherein said selecting steps includes:

causing said number of wafers to progress longitudinally along a given path;

pushing off said path to reject, by means of a wedge-shaped projection which extends laterally across at least a portion of said path, only those wafers whose major surface is oriented other than in said given direction;

collecting said rejected wafers; and causing said collected wafers to again progress along said given path.

References Cited

UNITED STATES PATENTS 3,047,933 8/1962 Chick et al. ---------- 29—569

WILLIAM I. BROOKS, *Primary Examiner.*

U.S. Cl. X.R.

029—569, 589, 203